United States Patent
Wang et al.

(10) Patent No.: US 10,615,266 B2
(45) Date of Patent: Apr. 7, 2020

(54) THIN-FILM TRANSISTOR, MANUFACTURING METHOD THEREOF, AND ARRAY SUBSTRATE

(71) Applicant: BOE TECHNOLOGY GROUP CO., LTD., Beijing (CN)

(72) Inventors: Guoying Wang, Beijing (CN); Jiangbo Chen, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/571,038

(22) PCT Filed: Jun. 29, 2017

(86) PCT No.: PCT/CN2017/090779
§ 371 (c)(1),
(2) Date: Oct. 31, 2017

(87) PCT Pub. No.: WO2018/054122
PCT Pub. Date: Mar. 29, 2018

(65) Prior Publication Data
US 2019/0214485 A1  Jul. 11, 2019

(30) Foreign Application Priority Data
Sep. 23, 2016  (CN) .......................... 2016 1 0849619

(51) Int. Cl.
H01L 29/66 (2006.01)
H01L 29/786 (2006.01)
(Continued)

(52) U.S. Cl.
CPC ...... H01L 29/66757 (2013.01); H01L 21/324 (2013.01); H01L 21/32105 (2013.01);
(Continued)

(58) Field of Classification Search
CPC ......... H01L 29/66757; H01L 29/66969; H01L 29/78618; H01L 29/78666;
(Continued)

(56) References Cited

U.S. PATENT DOCUMENTS 8,373,198 B2    2/2013  Chung et al.
9,660,060 B2 *  5/2017  Chang ............... H01L 29/66969
(Continued)

OTHER PUBLICATIONS

1st Office Action dated Nov. 6, 2018 in CN201610849619.9.
(Continued)

Primary Examiner — Matthew L Reames
(74) Attorney, Agent, or Firm — Syncoda LLC; Feng Ma

(57) ABSTRACT

A method for manufacturing a thin-film transistor is disclosed, which includes forming an active layer over a substrate, and performing oxidation treatment to a channel region of the active layer for controlling a carrier concentration in the channel region of the active layer. The active layer having a high carrier concentration is directly formed, and the oxidation treatment can be configured to reduce a carrier concentration of the channel region of the active layer to a level where a gating property of the thin-film transistor is still maintained. In the thin-film transistor manufactured thereby, there is a relatively small contact resistance between a source electrode and a source electrode region of the active layer and between the drain electrode and the drain electrode region of the active layer.

15 Claims, 7 Drawing Sheets

(51) Int. Cl.
  *H01L 21/321* (2006.01)
  *H01L 21/324* (2006.01)
  *H01L 27/12* (2006.01)

(52) U.S. Cl.
  CPC ........ *H01L 27/127* (2013.01); *H01L 27/1218* (2013.01); *H01L 27/1225* (2013.01); *H01L 29/66969* (2013.01); *H01L 29/7869* (2013.01); *H01L 29/78618* (2013.01); *H01L 29/78666* (2013.01); *H01L 29/78675* (2013.01); *H01L 29/78696* (2013.01)

(58) Field of Classification Search
  CPC ........... H01L 29/78675; H01L 29/7869; H01L 29/78696; H01L 21/32105; H01L 21/324; H01L 27/1218; H01L 27/1225; H01L 27/127
  See application file for complete search history.

(56) References Cited

U.S. PATENT DOCUMENTS

| | | | |
|---|---|---|---|
| 2010/0006834 A1* | 1/2010 | Kim | H01L 29/7869 257/43 |
| 2013/0122649 A1 | 5/2013 | Zhang et al. | |
| 2014/0011329 A1 | 1/2014 | Zhang et al. | |
| 2014/0048806 A1* | 2/2014 | Price | H01L 29/78618 257/57 |
| 2014/0197408 A1 | 7/2014 | Tsuruma et al. | |
| 2016/0043227 A1 | 2/2016 | Zhang et al. | |

OTHER PUBLICATIONS

International Search Report and Written Opinion dated Sep. 1, 2017 in PCT/CN2017/090779.
2nd Office Action dated Mar. 19, 2019 in CN201610849619.9.

* cited by examiner

Forming an active layer 20 over a substrate 10, such that the active layer 20 is configured to comprise a source electrode region 21, a drain electrode region 22, and a channel region 23 —S10

Treating the channel region 23 to reduce a carrier concentration of the channel region 23 to thereby maintain a gating property of the thin-film transistor —S20

Sequentially forming a gate-insulating layer 30, a gate electrode 40, a passivation layer 50, a source electrode 61, and a drain electrode 62 over the substrate 10 with the active layer 20 disposed thereover, wherein the source electrode 61 and the drain electrode 62 are respectively in contact with the source electrode region 21 and the drain electrode region 22 through at least one via 51 arranged in the passivation layer 50 —S30

FIG. 1

THIN-FILM TRANSISTOR, MANUFACTURING METHOD THEREOF, AND ARRAY SUBSTRATE

CROSS-REFERENCE TO RELATED APPLICATION

The present application claims priority to Chinese Patent Application No. 201610849619.9 filed on Sep. 23, 2016, the disclosure of which is hereby incorporated by reference in its entirety.

TECHNICAL FIELD

The present disclosure relates generally to a field of display technologies, and specifically to a method for manufacturing a thin-film transistor, a thin-film transistor manufactured thereby, and an array substrate comprising the thin-film transistor.

BACKGROUND

With the development of various display technologies, such as liquid crystal display (LCD) technologies, organic light-emitting diode (OLED) display technologies, flexible display technologies, more and more display panels with a big size and a high resolution are hitting the market.

SUMMARY

In order to address the aforementioned issues associated with the conventional display technology, the present disclosure provides the following technical solutions.

In a first aspect, the present disclosure provides a method for manufacturing a thin-film transistor. The method includes the steps of:

forming an active layer over a substrate, wherein the active layer comprises a channel region; and treating the active layer for controlling a carrier concentration in the channel region of the active layer.

According to some embodiments of the disclosure, the step of treating the active layer for controlling a carrier concentration in the channel region of the active layer comprises: performing oxidation treatment to the channel region of the active layer.

In the method as described above, the active layer can be configured to have a relatively high carrier concentration in the channel region, and the treatment, such as the oxidation treatment, can be configured such that the channel region of the active layer has a reduced carrier concentration which still ensures a gating property of the thin-film transistor.

In the above mentioned method, the oxidation treatment can be performed at a temperature of <300° C.

In some embodiments of the method, the step of performing oxidation treatment to the channel region of the active layer comprises: performing annealing treatment to the channel region in a gas of $O_2$.

In some other embodiments of the method, the step of performing oxidation treatment to the channel region of the active layer comprises: treating the channel region with a plasma of $O_2$ or $N_2O$.

In the method, the active layer can include a plurality of sub-active layers, and as such, the step of forming an active layer over a substrate comprising: sequentially forming the plurality of sub-active layers over the substrate such that the plurality of sub-active layers have an increasing carrier concentration in a direction from closest to the substrate to farthest from the substrate.

As such, the step of performing oxidation treatment to the channel region of the active layer comprises: performing oxidation treatment to a channel region of one of the plurality of sub-active layers that is farthest from the substrate.

According to some embodiments, the plurality of sub-active layers consist of two sub-active layers.

The active layer can further include a source electrode region and a drain electrode region. The source electrode region, the channel region, and the drain electrode region are aligned in a direction substantially in parallel to a top surface of the substrate; and the channel region is sandwiched between the source electrode region and the drain electrode region.

According to some embodiments, between the step of forming an active layer over a substrate and the step of performing oxidation treatment to the channel region of the active layer, the method can further include a step of forming a photoresist layer over the active layer such that the photoresist layer covers each of a source electrode region and a drain electrode region of the active layer but does not cover the channel region of the active layer.

According to some embodiments, after the step of performing oxidation treatment to the channel region of the active layer, the method further includes a step of forming a gate insulating layer and a gate electrode over the active layer.

Herein the step of forming a gate insulating layer and a gate electrode over the active layer comprises the sub-steps of:

sequentially forming an insulating thin film and a metal thin film over the photoresist layer; and removing the photoresist layer to thereby form the gate insulating layer and the gate electrode over the channel region of the active layer.

According to some embodiments, after the step of forming a gate insulating layer and a gate electrode over the active layer, the method further comprises a step of sequentially forming a passivation layer, a source electrode and a drain electrode, wherein the source electrode and the drain electrode are respectively in electrical contact with the source electrode region and the drain electrode region of the active layer through at least one via in the passivation layer.

In any of the embodiments of the method, the active layer can include at least one of a metal oxide, an amorphous silicon, or a polysilicon. The active layer can, for example, include a metal oxide, which can be zinc oxide, and can specifically be indium gallium zinc oxide (IGZO).

In the above embodiments of the method where the active layer includes a metal oxide, the step of forming an active layer over a substrate can include:

depositing the active layer over the substrate by magnetron sputtering.

In any of the embodiments of the method as described above, the active layer can have a thickness of 30-70 nm, and can have a thickness of a different range.

In any of the embodiments of the method as described above, the substrate can be a flexible substrate, and can be other types of substrate.

In a second aspect, the present disclosure further provides a thin-film transistor that is manufactured by the method according to any one of the embodiments as described above.

In a third aspect, the present disclosure further provides an array substrate, which includes a thin-film transistor as described above.

In the disclosure, the active layer having a high carrier concentration is first formed on the substrate, which then undergoes a treatment to reduce the carrier concentration of the channel region in the active layer to an appropriate level such that a gating property of the thin-film transistor is maintained.

Because the active layer having a high carrier concentration is directly formed, there is a relatively small contact resistance between the source electrode and the source electrode region and between the drain electrode and the drain electrode region, thereby negating the requirement for conductorizing the source electrode and the drain electrode, which in turn prevents a mobility rate of the active layer from decreasing, leading to an increased reliability of the thin-film transistor.

Additionally, because the carrier concentration of the channel region can be controlled when the channel region undergoes treatment, properties of a thin-film transistor, such as the threshold voltage (i.e., the voltage controlling a thin-film transistor to turn on or off), can be adjusted, which leads to an improved controllability of the thin-film transistor manufactured thereby.

BRIEF DESCRIPTION OF DRAWINGS

To more clearly illustrate some of the embodiments provided by the present disclosure, the following is a brief description of the drawings. The drawings in the following descriptions are only illustrative of some embodiments. For those of ordinary skill in the art, other drawings of other embodiments can become apparent based on these drawings.

FIG. 1 illustrates a flowchart of a method for manufacturing a thin-film transistor according to some embodiments of the present disclosure;

DETAILED DESCRIPTION

In the following, with reference to the drawings of the embodiments disclosed herein, the technical solutions of the embodiments of the invention will be described in a clear and fully understandable way. It is noted that the described embodiments are merely a portion but not all of the embodiments of the invention. Based on the described embodiments of the invention, those ordinarily skilled in the art can obtain other embodiment(s), which come(s) within the scope sought for protection by the invention.

A display panel comprises an array substrate, which typically comprises thin-film transistors. In a top-gate self-aligned thin-film transistor, the active layer can be divided into a high electrical resistance region that corresponds to the gate electrode and a low electrical resistance region that corresponds to the source electrode and the drain electrode.

Because the gate electrode does not overlap with the low electrical resistance region in the active layer, there is a relatively small parasitic capacitance between the gate electrode and the active layer, which causes a reduced electrical resistance in the active layer, thereby resulting in a reduced signal delay and an improved display effect. As such, the top-gate self-aligned thin-film transistors have been widely applied in display panels having a big size and a high resolution.

In a conventional display technology, it's typically to first form an active layer having a low carrier concentration (therefore a high electrical resistance), and then to perform a conductorizing treatment to a region in the active layer that is in contact with the source electrode and the drain electrode. Yet the active layer that has been processed by the conductorizing treatment has a relatively low mobility rate, and the thin-film transistor manufactured in this way has a relatively low reliability.

In order to address these above mentioned issues associated with the conventional display technology, the present disclosure provides a method for manufacturing a thin-film transistor, a thin-film transistor manufactured thereby, and an array substrate containing the thin-film transistor.

In a first aspect, a method for manufacturing a thin-film transistor is disclosed.

Figure 2:
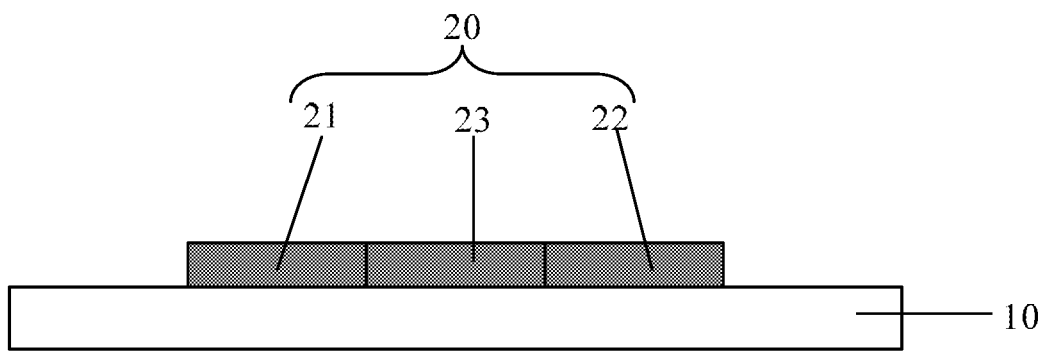
FIG. 2 shows a schematic view of the thin-film transistor being manufactured after one step of the method as described above.

FIG. 1 illustrates a flowchart of the method for manufacturing a thin-film transistor according to some embodiments of the present disclosure. As shown in FIG. 1, the method comprises the following steps:

S10: forming an active layer 20 over a substrate 10, such that the active layer 20 is configured to comprise a source electrode region 21, a drain electrode region 22, and a channel region 23 (as shown in FIG. 2);

Herein the active layer 20 is configured to have a high concentration of carriers. It is noted that there is no limitation to the range of the carrier concentration of the active layer 20, as long as a level of the carrier concentration of the active layer 20 causes a relatively small contact resistance between a source electrode and the source electrode region 21 and between a drain electrode and the drain electrode region 22.

Herein, depending on a composition of the substrate 10, the substrate 10 can be a flexible substrate, a glass substrate, or a substrate of other compositions. If the substrate 10 is a flexible substrate, the flexible substrate needs to be disposed on a supporting substrate.

Herein, a composition of the active layer 20 can be selected depending on the type of the thin-film transistor. For example, the thin-film transistor can be an amorphous silicon thin-film transistor, a polysilicon thin-film transistor, a metal oxide thin-film transistor, or an organic thin-film transistor, etc.

As one illustrating example for step S10 of the method, a semiconductor thin film having a high carrier concentration, and a photoresist layer can first be sequentially formed over the substrate 10. After exposure, part of the photoresist layer can be retained to thereby cover a pattern of the active layer. Then the semiconductor thin film can undergo etching to thereby form the active layer 20, and the retained part of the photoresist layer can be removed subsequently.

Herein there is no limitation to the carrier concentration of the semiconductor thin film, as long as the semiconductor thin film has a sufficiently high carrier concentration to cause a relatively small contact resistance between a source electrode and the source electrode region 21 and between a drain electrode and the drain electrode region 22.

Figure 3:
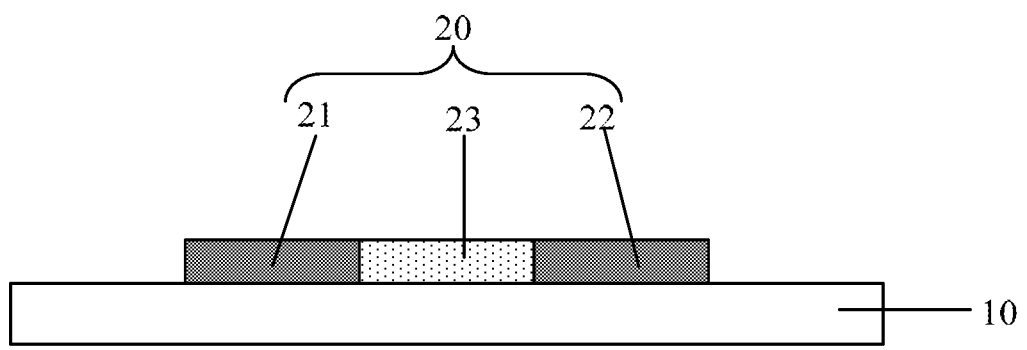
FIG. 3 shows a schematic view of the thin-film transistor being manufactured after another step of the method as described above.

S20: treating the channel region 23 to reduce a carrier concentration thereof to a level to still maintain a gating property of the thin-film transistor (as shown in FIG. 3). In other words, a carrier concentration of the source electrode region 21 and the drain electrode region 22 remains substantially unchanged whereas the carrier concentration of the channel region 23 is reduced.

The carrier concentration of the channel region 23 can be controlled by adjusting the condition for treating the channel region 23, which can have the flexibility to meet different requirements for a threshold voltage of the different thin-film transistors.

Herein there is no limitation to the manner of treating the channel region 23 to reduce the carrier concentration thereof, as long as the treatment can reduce the carrier concentration of the channel region 23 while still can maintain the carrier concentration of the source electrode region 21 and the drain electrode region 22 unaffected.

Figure 4A:
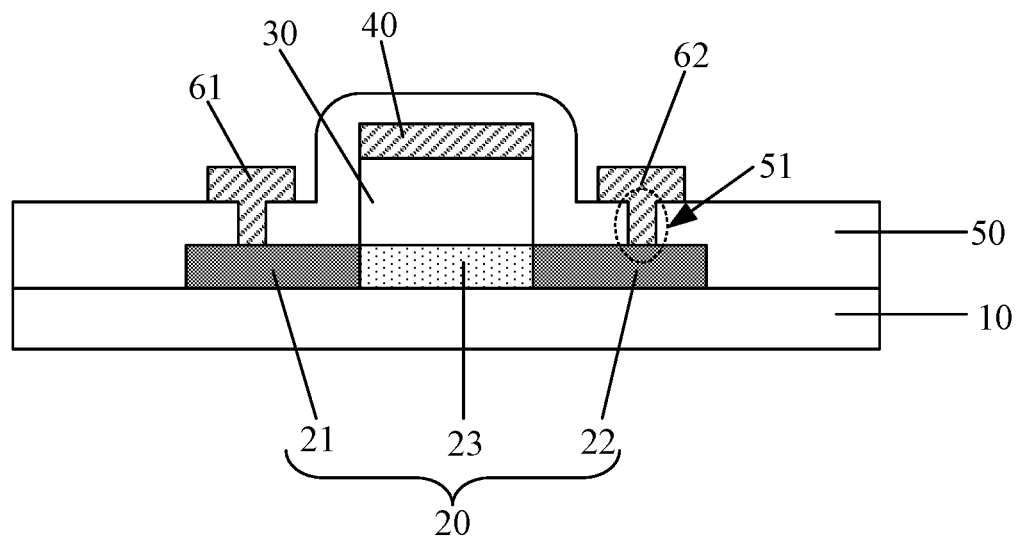
FIG. 4A is a schematic view of the thin-film transistor according to some embodiments of the present disclosure.
Figure 4B:
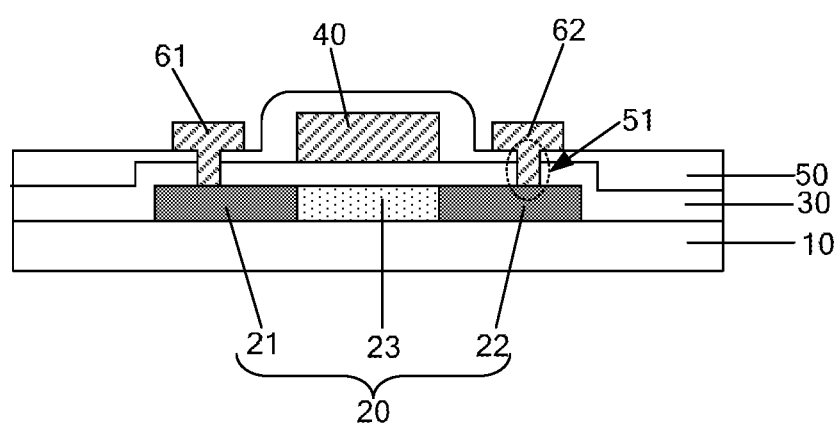
FIG. 4B is a schematic view of the thin-film transistor according to some other embodiments of the present disclosure.

S30: sequentially forming a gate-insulating layer 30, a gate electrode 40, a passivation layer 50, a source electrode 61, and a drain electrode 62 over the substrate 10 having the active layer 20 disposed thereover, wherein the source electrode 61 and the drain electrode 62 are configured to be respectively in electrical contact with the source electrode region 21 and the drain electrode region 22 through at least one via 51 arranged in the passivation layer 50 (as shown in FIG. 4A and FIG. 4B).

Specifically, as to the structure of one embodiment of the thin-film transistor as shown in FIG. 4A, the source electrode 61 and the drain electrode 62 can be respectively in electrical contact with the source electrode region 21 and the drain electrode region 22 through the vias 51 which are arranged only in the passivation layer 50.

Specifically, as to the structure of another embodiment of the thin-film transistor as shown in FIG. 4B, the source electrode 61 and the drain electrode 62 can be respectively in electrical contact with the source electrode region 21 and the drain electrode region 22 through the vias 51 which are arranged in both the passivation layer 50 and the gate insulating layer 30.

Herein, there is no limitation to the manufacturing processes of the various film layers, such as the gate-insulating layer 30, the gate electrode 40, the passivation layer 50, the source electrode 61, and the drain electrode 62, that are all disposed on the side of the active layer 20 opposing to the substrate 10.

In the aforementioned method for manufacturing a thin-film transistor as described above, an active layer 20 having a high carrier concentration is first formed over the substrate 10, and the active layer 20 is then treated to reduce the carrier concentration of the channel region 23 to an appropriate level that still maintains a gating property of the thin-film transistor.

In the embodiments of the method as described above, the active layer 20 having a high carrier concentration is directly formed, which causes a relatively small contact resistance between the source electrode 61 and the source electrode region 21 and between a drain electrode 62 and the drain electrode region 22. Consequently, this negates the need for conductorizing the source electrode 61 and the drain electrode 62, which in turn prevents a mobility rate of the active layer 20 from decreasing, leading to an increased reliability of the thin-film transistor.

Additionally, because the carrier concentration of the channel region 23 can be controlled when the channel region 23 undergoes treatment, properties of a thin-film transistor, such as the threshold voltage (i.e., the voltage controlling a thin-film transistor to turn on or off), can be adjusted, which leads to an improved controllability of the thin-film transistor.

Figure 5A:
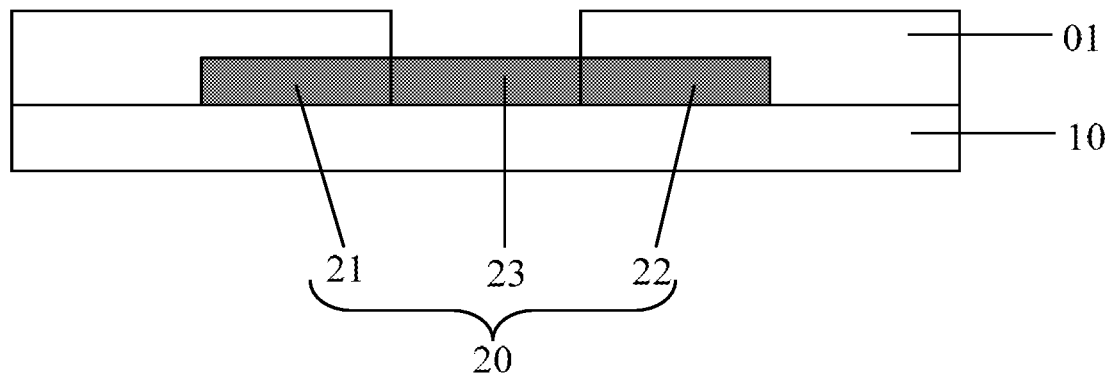
FIG. 5A shows a schematic view of the thin-film transistor being manufactured after yet another step of the method as described above.
Figure 5B:
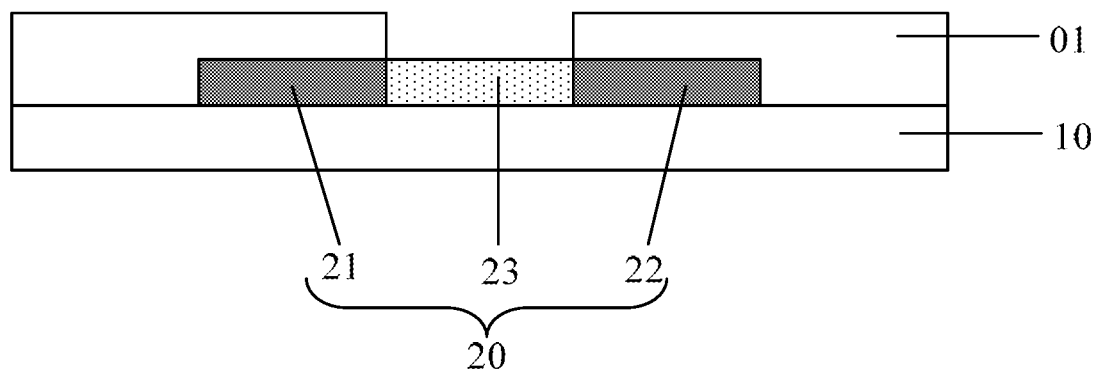
FIG. 5B shows a schematic view of the thin-film transistor being manufactured after yet another step of the method as described above.

In some embodiments of the method, the step of treating the channel region 23 comprises the following sub-steps:

forming a photoresist layer 01 over the substrate having the active layer 20 disposed thereover such that the channel region 23 is exposed (i.e., the channel region 23 is in a region that is not covered by the photoresist layer 01), as illustrated in FIG. 5A; and treating the channel region 23, as illustrated in FIG. 5B.

Figure 6A:
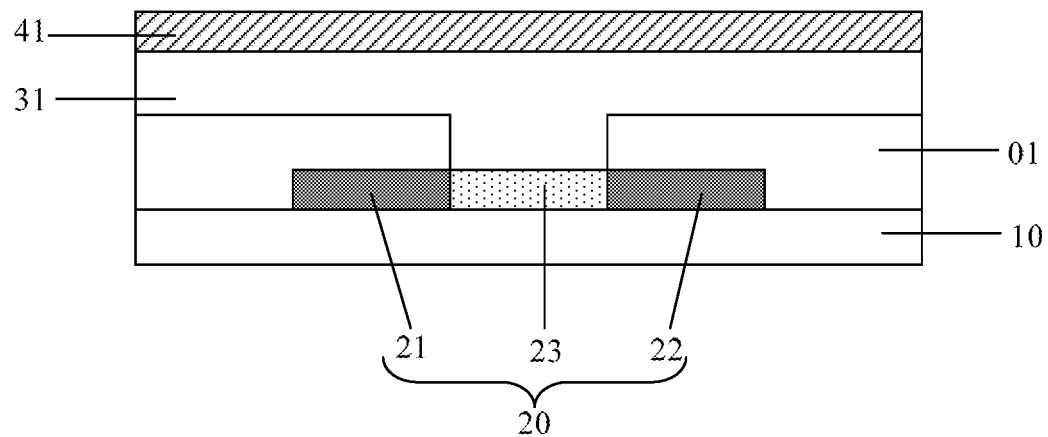
FIG. 6A shows a schematic view of the thin-film transistor being manufactured after yet another step of the method as described above.

After the step of treating the channel region 23, the method further comprises a step of forming a gate insulating layer 30 and a gate electrode 40. Specifically, the step can comprise the following sub-steps:

sequentially forming an insulating thin film 31 and a metal thin film 41, as shown in FIG. 6A; and removing the photoresist layer 01 to thereby form the gate insulating layer 30 and the gate electrode 40 having a same pattern.

In the method disclosed herein, a photoresist layer 01 is formed over a substrate 10 having an active layer 20 formed thereover such that the channel region 23 is exposed, then an insulating thin film 31 and a metal thin film 41 are sequentially formed over the substrate 10 having the photoresist layer 01 disposed thereover.

On the one hand, the photoresist layer 01 can protect the source electrode region 21 and the drain electrode region 22 during treatment of the channel region 23, which can prevent the carrier concentration of the source electrode region 21 and the drain electrode region 22 from being reduced;

On the other hand, after the sequential formation of the insulating thin film 31 and the metal thin film 41, the photoresist layer 01 can be directly removed to form the gate insulating layer 30 and the gate electrode 40 of a top-gate self-aligned thin-film transistor. As such, it can result in a simplified manufacturing process, and it can also avoid the occurrence of an offset issue resulted during a fabrication process of the gate insulating layer 30 and the gate electrode 40 by wet etching, which in turn can effectively reduce a parasitic resistance of the source electrode 61 and the drain electrode 62, leading to an improved property of the thin-film transistor.

Figure 7A:
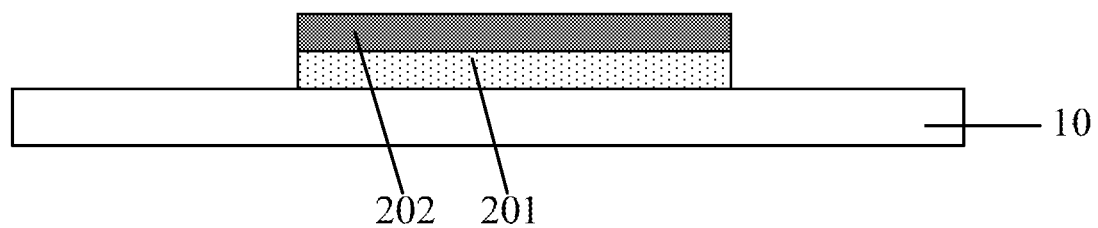
FIG. 7A is a schematic view of an active layer of the thin-film transistor according to some embodiments of the present disclosure.

According to some embodiments, the active layer 20 can comprise more than one sub-active layer. In one illustrating embodiment that follows, the active layer 20 comprises two sub-active layers, i.e., a first sub-active layer 201 and a second sub-active layer 202, as illustrated in FIGS. 7A and 7B.

In these embodiments as described above, the first sub-active layer 201 and the second sub-active layer 202 are both disposed over the substrate. The first sub-active layer 201 is arranged to be closer to the substrate 10 and the second sub-active layer 201 is arranged to be farther from the substrate 10 (i.e., the first sub-active layer 201 is between the substrate 10 and the second sub-active layer 202). The first sub-active layer 201 is configured to have a smaller carrier concentration than the second sub-active layer 202.

Figure 7B:
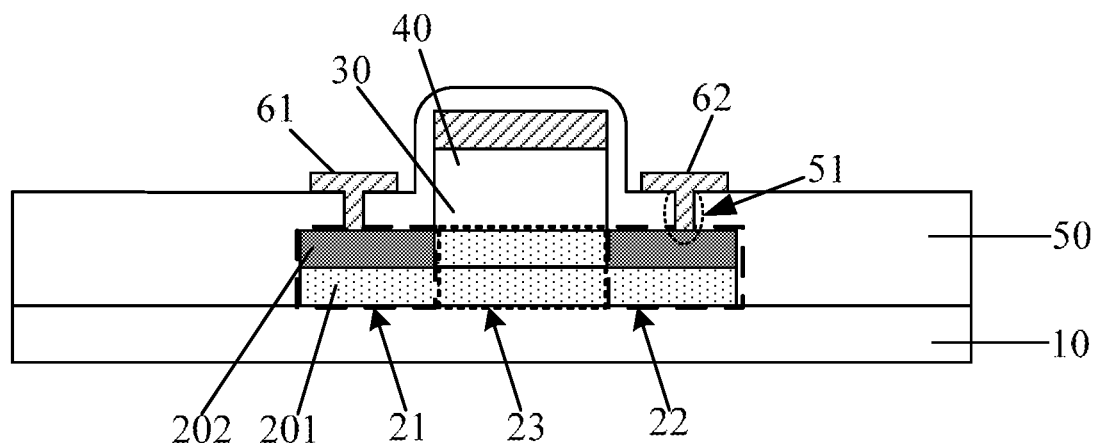
FIG. 7B is a schematic view of the thin-film transistor according to some embodiments of the present disclosure.

In these embodiments as described above, the step of treating the channel region 23 comprises a sub-step of: treating a channel region 23 in the second sub-active layer 202, as shown in FIG. 7B.

Herein there is no limitation to the carrier concentration of the first sub-active layer 201, as long as the carrier concentration thereof can maintain the gating property of the thin-film transistor. There is also no limitation to the carrier concentration of the second sub-active layer 202, as long as the carrier concentration thereof can cause a low level of contact resistance between the source electrode 61 and the source electrode region 21 and between the drain electrode 62 and the drain electrode region 22. The carrier concentration of the first sub-active layer 201 can be substantially same as, or can be different from, the carrier concentration of channel region 23 in the second sub-active layer 202.

Herein it is also noted that the first sub-active layer 201 and the second sub-active layer 202 can be formed through a one-time patterning process.

It is further noted that there is no limitation to the thicknesses of the first sub-active layer 201 and the second sub-active layer 202, which can be configured based on a structure of the thin-film transistor. Yet the thickness of the second sub-active layer 202 can be reduced to save time in the treatment of the channel region 23.

In the embodiments of the method as described above, a first sub-active layer 201 and a second sub-active layer 202 are sequentially formed over a substrate 10. The first sub-active layer 201 is configured to have a smaller carrier concentration than the second sub-active layer 202, and as such, the first sub-active layer 201 is configured to ensure a gating property of the thin-film transistor, whereas the second sub-active layer 202 is configured to reduce the electric resistance between the source electrode 61 and the source electrode region 21 and between the drain electrode 62 and the drain electrode region 22, to thereby increase the mobility rate of the active layer 20. Additionally, the first sub-active layer 201 and the second sub-active layer 202 can be formed through a one-time patterning process, which thus adds no extra manufacturing processes.

It should be noted that besides the embodiments as described above where the active layer 20 comprises two sub-active layers (i.e. the first sub-active layer 201 and the second sub-active layer 202), the active layer can comprise more than two sub-active layers.

In order to both ensure the gating property of the thin-film transistor and to reduce the electric resistance between the source electrode 61 and the source electrode region 21 of the active layer 20 and between the drain electrode 62 and the drain electrode region 22 of the active layer 20, it can be configured that the more than two sub-active layers have an increasing carrier concentration in an order from the sub-active layer closest to the substrate 10 to the sub-active layer farthest from the substrate 10.

As such, the step of treating a channel region 23 of the active layer 20 can comprise treating a channel region 23 of the sub-active layer farthest from the substrate 10 to reduce the carrier concentration thereof.

According to some embodiments, the active layer 20 can comprise a metal oxide material, an amorphous silicon material, or a polysilicon material.

As such, the step of treating the channel region 23 can comprise: performing an oxidization treatment to the channel region 23 at a temperature of <300° C. The temperature can be 50° C., 100° C., 150° C., 200° C., or 250° C.

If the active layer 20 comprises a metal oxide material, the active layer 20 can be deposited by magnetron sputtering in a gas of argon or of helium. The active layer 20 formed thereby has a high carrier concentration and thus has a low electric resistance due to a large amount of oxygen vacancies that are produced during the formation process. By means of oxidization, the oxygen atoms in the metal oxide material can be increased, in turn causing a decreased carrier concentration of the channel region 23.

If the active layer 20 comprises an amorphous silicon material or a polysilicon material, the process of oxidization can release the hydrogen atoms in the amorphous silicon material or the polysilicon material, in turn causing a decreased carrier concentration of the channel region 23.

In some preferred embodiments, the active layer 20 has a composition of a metal oxide material, which can comprise zinc oxide. In one illustrating example, the active layer 20 can comprise indium gallium zinc oxide (IGZO).

Because the method as described above can be employed to manufacture a metal oxide thin-film transistor, an amorphous silicon thin-film transistor, or a polysilicon thin-film transistor, thus has a wide field of application.

In addition, because in the method as described above, the channel region 23 can undergo oxidization treatment in a low-temperature environment to reduce the carrier concentration in the channel region, the method can thus be employed in the manufacturing of a flexible display panel, therefore enlarging the scope of application.

Because the process of annealing in an oxygen ($O_2$) gas, or the process of treatment using a plasma of $O_2$ or $N_2O$, is a relatively mature and low-cost technology, in the oxidization treatment of the method as described above, the step of performing an oxidization treatment to the channel region 23 comprises: performing an annealing treatment to the channel region 23 in a gas of $O_2$, or treating the channel region 23 with a plasma of $O_2$ or $N_2O$.

In some preferred embodiments, the active layer 20 can have a thickness of 30-70 nm. For example, the thickness of the active layer 20 can be 40 nm, 45 nm, 50 nm, 55 nm, 60 nm, or 65 nm.

In the embodiments where the active layer 20 comprises a first sub-active layer 201 and a second sub-active layer 202, a sum of a thickness of the first sub-active layer 201 and a thickness of the second sub-active layer 202 can have a range of 30-70 nm.

In the embodiments where the active layer 20 comprises more than two sub-active layers, a sum of a thickness of the more than two sub-active layers can have a range of 30-70 nm.

By configuring that a thickness of the active layer 20 is in the range of 30-70 nm, besides that the properties of a thin-film transistor can be ensured, the thickness of the thin-film transistor can be reduced, thereby saving the manufacturing cost.

One specific embodiment is provided below for illustration of the aforementioned method for manufacturing a thin-film transistor.

Figure 8:
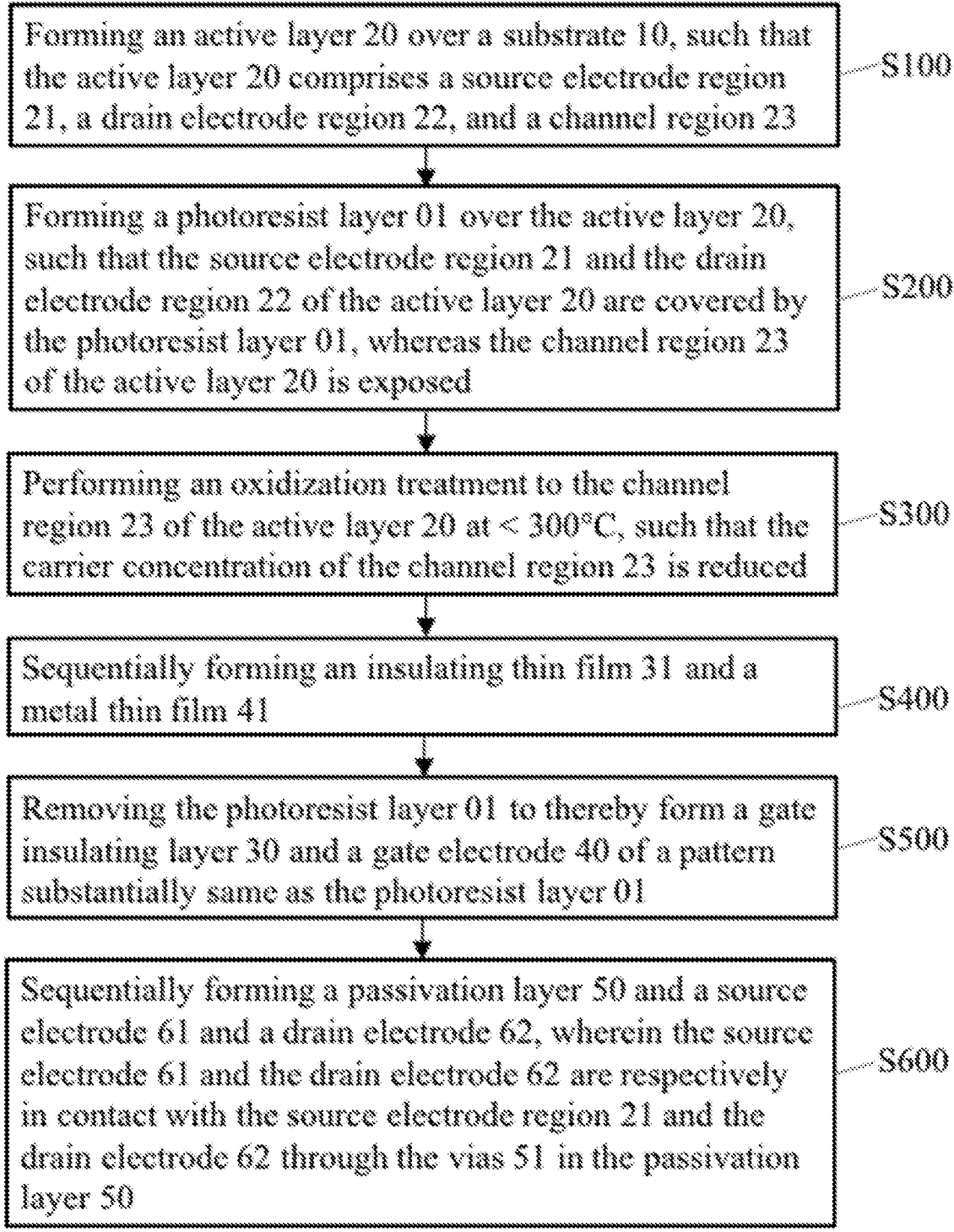
FIG. 8 illustrates a flowchart of a method for manufacturing a thin-film transistor according to some embodiments of the present disclosure.

As illustrated in FIG. 8, the embodiment of the method comprises the following steps:

S100: forming an active layer 20 over a substrate 10, wherein the active layer 20 comprises a source electrode region 21, a drain electrode region 22, and a channel region 23 (as shown in FIG. 2);

Herein the active layer 20 is configured to have a thickness of 30-70 nm, a composition of IGZO, and a high carrier concentration.

Specifically, a semiconductor thin film (i.e., a thin film of IGZO) can be deposited over the substrate 10 by magnetron sputtering in a gas of argon or of helium. Due to a large amount of oxygen vacancies that are produced during the formation process of the IGZO thin film, the semiconductor thin film has a high carrier concentration and thus has a low electric resistance.

Then a photoresist layer is formed over the IGZO thin film. After exposure, part of the photoresist layer can be retained to thereby cover a pattern which will be the pattern of the active layer 20.

Subsequently, the semiconductor thin film (i.e., the IGZO thin film) can undergo etching to thereby form the active layer 20, followed by removal of the retained part of the photoresist layer.

It is noted that there is no limitation to the manners for forming the semiconductor thin film: the photoresist layer can be a positive photoresist layer or a negative photoresist layer; and the etching over the semiconductor thin film can be via a dry etching, or a wet etching, depending on the composition of the semiconductor thin film.

S200: on the basis of S100, forming a photoresist layer 01 over the active layer 20, such that the source electrode region 21 and the drain electrode region 22 of the active layer 20 are covered by the photoresist layer 01, whereas the channel region 23 of the active layer 20 is exposed (as shown in FIG. 5A).

S300: on the basis of S200, performing an oxidization treatment to the channel region 23 of the active layer 20 at a temperature of <300° C., such that the carrier concentration of the channel region 23 is reduced. Herein the extent to which the carrier concentration of the channel region 23 is reduced is based on the criteria that the reduced carrier concentration of the channel region 23 can still maintain a gating property of the thin-film transistor (as shown in FIG. 5B).

S400: on the basis of S300, sequentially forming an insulating thin film 31 and a metal thin film 41 (as shown in FIG. 6A).

Specifically, the insulating thin film 31 having a thickness of 100-400 nm can be formed by approaches such as plasma enhanced chemical vapor deposition (PECVD), and chemical vapor deposition (CVD), etc. The insulating thin film 31 can have a composition of silicon oxide, silicon nitride, silicon oxynitride, or other insulating materials.

The metal thin film 41 having a thickness of 100-200 nm can be formed by approaches such as magnetron sputtering, and the metal thin film 41 can have a composition of Mo, Al, Ti, Au, Cu, Hf, or Ta.

Figure 6B:
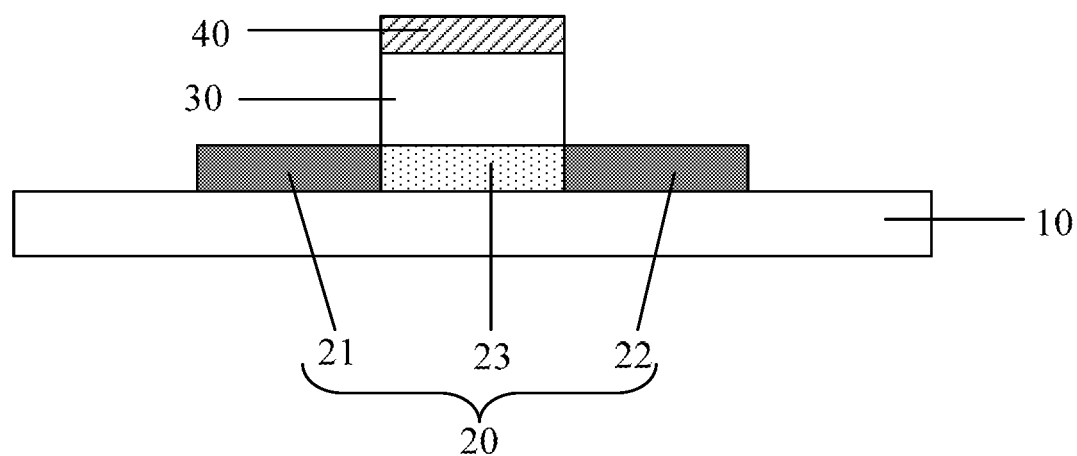
FIG. 6B shows a schematic view of the thin-film transistor being manufactured after yet another step of the method as described above.

S500: on the basis of S400, removing the photoresist layer 01 to thereby form a gate insulating layer 30 and a gate electrode 40 of a pattern substantially same as the photoresist layer 01 (as shown in FIG. 6B).

S600: on the basis of S500, sequentially forming a passivation layer 50, a source electrode 61 and a drain electrode 62, wherein the source electrode 61 and the drain electrode 62 are configured to be in electrical contact with the source electrode region 21 and the drain electrode region 22, respectively, through the vias 51 in the passivation layer 50 (as shown in FIG. 4A).

Herein the passivation layer 50 can have a substantially same manufacturing process and a substantially same composition as the gate insulating layer 30. The source electrode 61 and the drain electrode 62 can have a substantially same manufacturing process and a substantially same composition as the gate electrode 40.

In a second aspect, the present disclosure further provides a method for manufacturing an array substrate. The method comprises manufacturing thin-film transistors based on a method for manufacturing a thin-film transistor according to any of the embodiments as described above.

Briefly in the method for manufacturing an array substrate, during the manufacturing process of thin-film transistors, an active layer 20 having a high carrier concentration is first formed over a substrate 10, then a channel region 23 of the active layer 20 is treated such that a carrier concentration of the channel region 23 is reduced to a level which still maintains a gating property of the thin-film transistors.

In the method as described above, the active layer 20 having a high carrier concentration is directly formed, which causes a relatively small contact resistance between the source electrode 61 and the source electrode region 21 and between a drain electrode 62 and the drain electrode region 22. Consequently, this negates the need for conductorizing the source electrode 61 and the drain electrode 62, which in turn prevents the mobility rate of the active layer 20 from decreasing, leading to an increased reliability of the thin-film transistor, and thus an increased reliability of the array substrate manufactured thereby.

Additionally, because the carrier concentration of the channel region 23 can be controlled when the channel region 23 undergoes treatment, properties of a thin-film transistor, such as the threshold voltage, can be adjusted, which leads to an improved controllability of the thin-film transistor in the array substrate.

In a third aspect, the present disclosure further provides a thin-film transistor.

The thin-film transistor is manufactured by the method for manufacturing a thin-film transistor according to any one of the embodiments as described above, and the thin-film transistor manufactured thereby has a structure as illustrated in FIG. 4A, FIG. 4B, or FIG. 7B.

Because of the relatively small contact resistance between the source electrode 61 and the source electrode region 21, and between the drain electrode 62 and the drain electrode region 22, the active layer 20 has a relatively high mobility rate, thus the thin-film transistor has an improved property.

In a fourth aspect, the present disclosure further provides an array substrate, which comprises a thin-film transistor according to any of the embodiments as described above. In a preferred embodiment, the substrate of the array substrate is a flexible substrate.

Because the thin-film transistors in the array substrate can be manufactured in a low-temperature environment, the substrate in the array substrate can be a flexible substrate, and thus the array substrate can be employed in a flexible display panel, resulting in a broadened scope of application.

In a fifth aspect, the present disclosure further provides a display panel, which comprises an array substrate as described above. In some preferred embodiments, the display panel can be a liquid crystal display (LCD) panel, or a organic light-emitting diode (OLED) display panel.

In embodiments where the display panel is an LCD panel, the display panel comprises an array substrate, an opposing substrate, and a liquid crystal layer disposed between the array substrate and the opposing substrate. The array substrate comprises a thin-film transistor according to any of the embodiments as described above, a pixel electrode, and a common electrode, wherein the pixel electrode can be electrically coupled to a drain electrode 62 of the thin-film transistor.

The LCD panel can have different embodiments with regard to components of the display panel, such as the common electrode and a color film, whose technical details can be referenced to current technologies, and will be skipped here in the present disclosure.

In embodiments where the display panel is an OLED display panel, the display panel comprises an array substrate and an encasing substrate. The array substrate comprises a thin-film transistor according to any of the embodiments as described above. Herein in the array substrate, an anode is electrically coupled to a drain electrode 62 of the thin-film transistor.

The OLED display panel can have different embodiments with regard to the arrangement or the composition of the components of the display panel, such as the anode, a cathode, and an organic material layer disposed in between, whose technical details can be referenced to current technologies, and will be skipped here in the present disclosure.

Various modifications of, and equivalent acts corresponding to, the disclosed aspects of the exemplary embodiments, in addition to those described above, can be made by a person of ordinary skill in the art, having the benefit of the present disclosure without departing from the spirit and scope of the disclosure defined in the following claims, the scope of which is to be accorded the broadest interpretation so as to encompass such modifications and equivalent structures.

Although specific embodiments have been described above in detail, the description is merely for purposes of illustration. It should be appreciated, therefore, that many aspects described above are not intended as required or essential elements unless explicitly stated otherwise.

The invention claimed is:

1. A method for manufacturing a thin-film transistor, comprising:
   forming an active layer over a substrate, wherein the active layer comprises a channel region, a source electrode region, a drain electrode region and a plurality of sub-active layers; and
   forming a photoresist layer over the active layer such that the photoresist layer covers each of a source electrode region and a drain electrode region of the active layer but does not cover the channel region; and
   performing oxidation treatment to the channel region of the active layer for controlling a carrier concentration in the channel region of the active layer,
   forming a gate insulating layer and a gate electrode over the active layer, comprising the steps of sequentially forming an insulating thin film and a metal thin film over the photoresist layer; and
   removing the photoresist layer to thereby form the gate insulating layer and the gate electrode over the channel region of the active layer,
   wherein
   the forming an active layer comprises sequentially forming the plurality of sub-active layers over the substrate such that the plurality of sub-active layers have an increasing carrier concentration in a direction from closest to the substrate to farthest from the substrate, and that the plurality of sub-active layer is formed through a one-time patterning process;
   the source electrode region, the channel region, and the drain electrode region are aligned in a direction substantially in parallel to a top surface of the substrate, and the channel region is sandwiched between the source electrode region and the drain electrode region.

2. The method of claim 1, wherein the oxidation treatment is performed at a temperature of <300° C.

3. The method of claim 2, wherein the performing oxidation treatment to the channel region of the active layer comprises:
   performing annealing treatment to the channel region in a gas of $O_2$.

4. The method of claim 2, wherein the performing oxidation treatment to the channel region of the active layer comprises:
   treating the channel region with a plasma of $O_2$ or $N_2O$.

5. The method of claim 1, wherein the performing oxidation treatment to the channel region of the active layer comprises:
   performing oxidation treatment to a channel region of one of the plurality of sub-active layers that is farthest from the substrate.

6. The method of claim 1, wherein the plurality of sub-active layers consist of two sub-active layers.

7. The method of claim 1, further comprising, after the forming a gate insulating layer and a gate electrode over the active layer:
   sequentially forming a passivation layer, a source electrode and a drain electrode, wherein the source electrode and the drain electrode are respectively in electrical contact with the source electrode region and the drain electrode region of the active layer through at least one via in the passivation layer.

8. The method of claim 1, wherein the active layer comprises at least one of a metal oxide, an amorphous silicon, or a polysilicon.

9. The method of claim 8, wherein the active layer comprises a metal oxide.

10. The method of claim 9, wherein the metal oxide comprises zinc oxide.

11. The method of claim 9, wherein the forming an active layer over a substrate comprises:
    depositing the active layer over the substrate by magnetron sputtering.

12. The method of claim 1, wherein the active layer has a thickness of 30-70 nm.

13. The method of claim 1, wherein the substrate is a flexible substrate.

14. The method of claim 1, wherein the sub-active layers are configured such that a first sub-active layer immediately on top of the substrate has a smaller carrier concentration than a second sub-active layer immediately on top of the first sub-active layer.

15. The method of claim 1, wherein the gate insulating layer has a thickness greater than the gate electrode's thickness.

* * * * *